US007579851B2

(12) United States Patent
Watanabe

(10) Patent No.: US 7,579,851 B2
(45) Date of Patent: Aug. 25, 2009

(54) OPERATION VOLTAGE SUPPLY APPARATUS AND OPERATION VOLTAGE SUPPLY METHOD FOR SEMICONDUCTOR DEVICE

(75) Inventor: Shinobu Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 5 days.

(21) Appl. No.: 11/979,290

(22) Filed: Nov. 1, 2007

(65) Prior Publication Data

US 2008/0084226 A1 Apr. 10, 2008

Related U.S. Application Data

(63) Continuation of application No. 10/936,675, filed on Sep. 9, 2004, now Pat. No. 7,307,434.

(30) Foreign Application Priority Data

Sep. 16, 2003 (JP) ............................ 2003-322803

(51) Int. Cl.
*G01R 31/26* (2006.01)
*G01R 31/02* (2006.01)

(52) U.S. Cl. .................... 324/754; 324/765; 324/158.1; 324/72.5

(58) Field of Classification Search ......... 324/654–765, 324/158.1, 72.5
See application file for complete search history.

(56) References Cited

U.S. PATENT DOCUMENTS 5,956,567 A 9/1999 Tomita
2002/0011853 A1* 1/2002 Noda ......................... 324/754
2002/0084795 A1* 7/2002 Cook et al. ................. 324/754
2004/0041581 A1* 3/2004 Saijyo et al. ................ 324/765
2006/0061374 A1* 3/2006 Shinozaki et al. ........... 324/754

FOREIGN PATENT DOCUMENTS

| | | |
|---|---|---|
| JP | 8227921 | 6/1996 |
| JP | 10270511 | 10/1998 |
| JP | 2000-206146 | 7/2000 |
| JP | 2002280428 | 9/2002 |
| JP | 2003185701 | 7/2003 |

* cited by examiner

*Primary Examiner*—Ha Tran T Nguyen
*Assistant Examiner*—Emily Y Chan
(74) *Attorney, Agent, or Firm*—Kubotera & Associates, LLC

(57) ABSTRACT

The voltage application probe (54) and the voltage measurement probe (56) are connected to the voltage application pad (74) and the voltage measurement pad (76) of the semiconductor device (70). The voltage application pad (74) and the voltage measurement pad (76) are connected by the conductor (78), measuring the voltage applied to the voltage application pad (74) through the voltage measurement probe (56). The voltage compensation circuit (14) in the voltage development device (10) operates to make the voltage applied to the voltage application pad (74) equal to the set voltage for the voltage development device (10). Even when the resistance between the voltage application probe (54) and the voltage application pad (74) increases, the accurate setting voltage is applied to the voltage application pad (74).

17 Claims, 14 Drawing Sheets

【図９】

OPERATION VOLTAGE SUPPLY APPARATUS AND OPERATION VOLTAGE SUPPLY METHOD FOR SEMICONDUCTOR DEVICE

CROSS-REFERENCE TO RELATED APPLICATIONS

This is a continuation application of the prior application Ser. No. 10/936,675 filed Sep. 9, 2004, now U.S. Pat. No. 7,307,404. The disclosure of Japanese Patent Application No. 2003-322803, filed on Sep. 16, 2003, is incorporated in the application by reference.

BACKGROUND OF THE INVENTION

1. Field of the Invention

The present invention relates to an operation voltage supply apparatus and an operation voltage supply method for a semiconductor device.

2. Description of the Related Art

A conventional operation voltage supply apparatus for a semiconductor device will be described with referent to FIGS. 12 and 13. FIG. 12 schematically shows the circuit structure of the conventional operation voltage supply apparatus and the operation voltage supply method for a semiconductor device. FIG. 13 is a side view of a connection condition between a probe and a current source terminal of a semiconductor device to be tested.

A voltage development device 10 includes a variable voltage source 12 and a voltage compensation circuit 14. The variable voltage source 12 develops a voltage equal to the set voltage (Vs) set from outside as needed. The standard voltage is the chassis ground of the voltage development device 10.

The voltage compensation circuit 14 is composed of the first operational amplifier 30 and the second operational amplifier 40. A positive input terminal 32 of the first operational amplifier 30 is connected to a voltage input terminal 22 of the voltage compensation circuit 14. An output terminal 36 of the first operational amplifier 30 is connected to a voltage output terminal 24 of the voltage compensation circuit 14. A negative input terminal 34 of the first operational amplifier 30 is connected to an output terminal 46 of the second operational amplifier 40. A positive input terminal 42 of the second operational amplifier 40 is connected to a measurement voltage input terminal 26 of the voltage compensation circuit 14. The output terminal 46 of the second operational amplifier 40 is connected to a negative input terminal 44 of the second operational amplifier 40, foaming a voltage follower circuit. By connecting the voltage output terminal 24 of the voltage compensation circuit 14 and the measurement voltage input terminal 26 with a conductor 28, the first operational amplifier 30 also forms a voltage follower circuit through the conductor 28 and the second operational amplifier 40. Because the voltage compensation circuit 14 is formed as mentioned before, it operates such that the setting voltage (Vs) inputted to the input terminal 22 becomes equal to the measurement voltage (Vm) input to the measurement voltage inputted terminal 26. Thus, the output voltage (Vo) at the voltage output terminal 24 is the sum of the setting voltage (Vs) and the voltage difference ΔV between the setting voltage (Vs) and the measurement voltage (Vm); that is $Vo=Vs+\Delta V$ wherein $\Delta V=Vs-Vm$. Inside connections of the voltage development device 10 are made by a printed circuit board or conductors as designed.

A probe card 51 includes a voltage-application probe 55. The voltage application probe 55 connects electrically a voltage application pad 75 of a semiconductor device 72 to be tested and the voltage output terminal 24 of the voltage development device 10 so that the voltage at the voltage output terminal 24 of the voltage development device 10 is applied to the voltage application pad 75 of the semiconductor device 72.

The voltage compensation circuit 14 assures that the output voltage (Vo) at the voltage output terminal 24 of the voltage development device 10 is equal to the setting voltage (Vs), however, to increase the accuracy of a voltage applied to the voltage application pad 75 of the semiconductor device 72, it is desired to input the measurement voltage near the voltage application pad 75 to the measurement voltage input terminal 26 of the voltage development device 10.

As a measurement probe of the semiconductor device, for measurement by using a tester, the probe for force and sense has been proposed to connect to a terminal installed at the semiconductor device (for example, Patent document 1: JP2000-206146).

The voltage application, however, is made by one probe as described with reference to FIGS. 12 and 13.

The conventional voltage application method has a disadvantage. For example, it is assumed that the semiconductor device 72 is the one for voltage measurement by using a probe. When a deposit 101 with a resistance component adheres to a tip of the voltage application probe 55, the contact resistance between the voltage application probe 55 and the voltage application pad 75 of the semiconductor device 72 increases. Even though the accurate voltage is outputted from the voltage output terminal 24 of the voltage development device, the resistance component of the deposit 101 produces a voltage drop, providing a voltage lower than the setting voltage at the semiconductor device 75. This deposit 101 is considered to be mainly oxidized aluminum that is chipped from the voltage application pad 75 of the semiconductor device 72 when the probe contacts the terminal.

With respect to FIG. 14, an example of test with the deposit 101 adhered will be described. If the setting voltage (Vs) is 3.0 V, a voltage of 3.0 V is applied to the tip of the voltage application probe 55. Now, if the current through the voltage application probe 55 is 100 mA and the contact resistance is 5Ω during the operation of the semiconductor device 72, only $2.5\text{ V}=3.0\text{ V}-5\Omega\times100\text{ mA}$ is applied to the voltage application pad 75 due to the voltage drop.

If the margin of a voltage applied to the voltage application pad 75 is 10% and approximately 3V is applied to an LSI which operates on a low voltage, a good product can be determined to be defective because the applied voltage is lower than the setting voltage. To prevent this deficiency, the general practice is to polish the tip of a prob. However it decreases the productivity due to the time loss by removing and polishing of the probe card.

FIG. 15 shows the contact resistance versus the number of contact times by the probe. The horizontal axis represents the number of contacts with the terminal of a voltage source by the probe. The vertical axis represents the value of contact resistance. The curve I of FIG. 15 shows the contact resistance when the probe makes a number of contacts with the voltage source terminal under the condition of a current of 100 mA. The curve II of FIG. 15 shows the contact resistance when the probe contacts the voltage source terminal with no electric current. When the probe contacts the voltage source terminal with a current of 100 mA, the contact resistance increases with fewer contacts than the case where no current is conducted.

A probe on the market, whose contact resistance is increased by the deposit even with no electric current, is usable without polishing it because the contact resistance is only about 1Ω after the number of contacts with the voltage source terminal by the probe exceeds 3000 (Curve II in FIG. 15). On the other hand, when a current of 100 mA is conducted through the probe, the contact resistance exceeds 5Ω at only about 500 contacts (Curve I). When an operating current is 100 mA, the voltage drop by the contact resistance is 5Ω×100 mA=0.5V.

If the applied voltage is greater than 5V, it is within 10% of the voltage margin, however, for example, if the applied voltage is about 3.3 V for a low voltage LSI, it will be out of 10% of the voltage margin.

SUMMARY OF THE INVENTION

An object of the present invention is to provide an operation voltage supply apparatus and an operation voltage supply method for a semiconductor device that is able to decrease the frequency of replacing and/or polishing the probe card when the probe card is repeatedly used to supply and measure the operation voltage of the semiconductor device.

To achieve the object, the operation voltage supply apparatus to the semiconductor device of the present invention is composed of the voltage development device and the probe card. The voltage development device includes the variable voltage source and the voltage compensation circuit. The setting voltage is set at the variable voltage source. The voltage compensation circuit includes the voltage input terminal, voltage output terminal, and measurement voltage input terminal. The set voltage at the variable voltage source is inputted to the voltage input terminal of the voltage compensation circuit. An output voltage to be applied to the voltage application pad of the semiconductor device is outputted from the voltage output terminal of the voltage compensation circuit. A measured voltage at the voltage measurement pad that connected to the voltage application pad through a conductor is inputted to the measurement voltage input terminal of the voltage compensation circuit. In the voltage compensation circuit, output voltage is the sum of the setting voltage and the difference between the setting voltage and the measurement voltage. The probe card separates the voltage application probe from the voltage measurement probe. The voltage application probe electrically connects the voltage application pad and the voltage output terminal. The voltage measurement probe electrically connects the voltage measurement pad and the measurement voltage input terminal, measuring the operation voltage as the measurement voltage of the semiconductor device.

A preferred embodiment for the operation voltage supply apparatus of the semiconductor device includes the first conductor that connects the voltage output terminal and the voltage application probe and the second conductor that electrically connects the measurement voltage input terminal and the voltage measurement probe.

Another preferred embodiment for the operation voltage supply apparatus includes a plurality of voltage application probes. Each voltage application probe is provided at one probe card and commonly connected with the voltage output terminal.

Still another preferred embodiment for the operation voltage supply apparatus includes a plurality of voltage measurement probes. Each voltage measurement probe is provided at one probe card and commonly connected to the measurement voltage input terminal.

The common usage of the voltage application pad and the voltage measurement is also preferred.

By utilizing the operation voltage supply apparatus for a semiconductor device according to the present invention to apply the operation voltage to the voltage application pad of the semiconductor device and set the variable voltage source such that the maximum set voltage is 3.3 V, it is preferred to make the voltage measurement probe contact the voltage measurement pad when the voltage application probe is contacted with the voltage application pad.

According to the operation voltage supply apparatus for the semiconductor device according to the present invention, the voltage application probe and the voltage measurement probe are connected to the voltage source terminal of the semiconductor device such that they are spaced from each other. The voltage applied to the voltage application pad is measured as a measurement voltage at the voltage measurement pad connected to the voltage application pad through the conductor. The accurate setting voltage is applied to the voltage source terminal even when the deposit with resistance component adheres to the tip of the voltage application probe because the output voltage is converted into the compensation voltage which is obtained by adding to the set voltage a different voltage between the set voltage and the measurement voltage.

By connecting the conductor between the voltage development device and the probe card with a conductor, it possible to select the positions of the semiconductor device and the voltage development device because the shape of the conductor is set freely.

The current necessary for the operation of the semiconductor device flows through the voltage application probe. The necessary current can be over the limit of the voltage application probe. Having a plurality of voltage application probes decreases the current for each probe.

Having a plurality of voltage measurement probes helps to reduce the probability of contact failure at the voltage measurement probe.

Having a common pad for the voltage application pad and the voltage measurement pad decreases the number of voltage source pads for the semiconductor device.

If the values of resistance of the deposit and the values of current through the deposit are equal, the voltage drops by the resistance element of the deposit become equal to each other, and the lower the application voltage, the higher the percentage of the voltage drop. It is possible to apply an accurate voltage by using the voltage supply method of the present invention, even when the application voltage is lower than 3.3 V.

DESCRIPTION OF THE PREFERRED EMBODIMENTS

Embodiments of the present invention will now be described with reference to the accompanying drawings. However, this invention is not limited to only these embodiments.

First Embodiment

Figure 1:
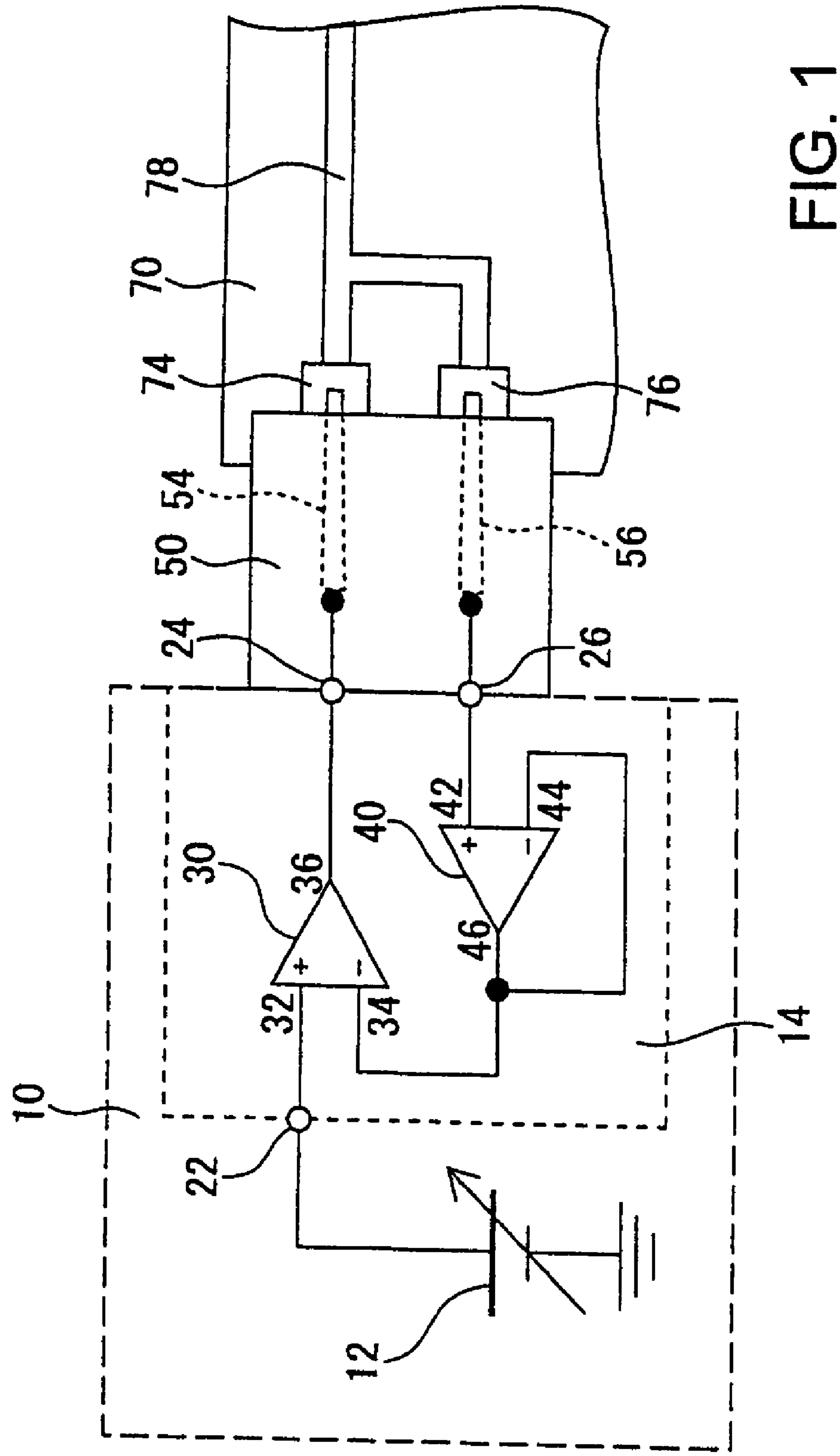
FIG. 1 is a schematic view of the first embodiment.
Figure 2:
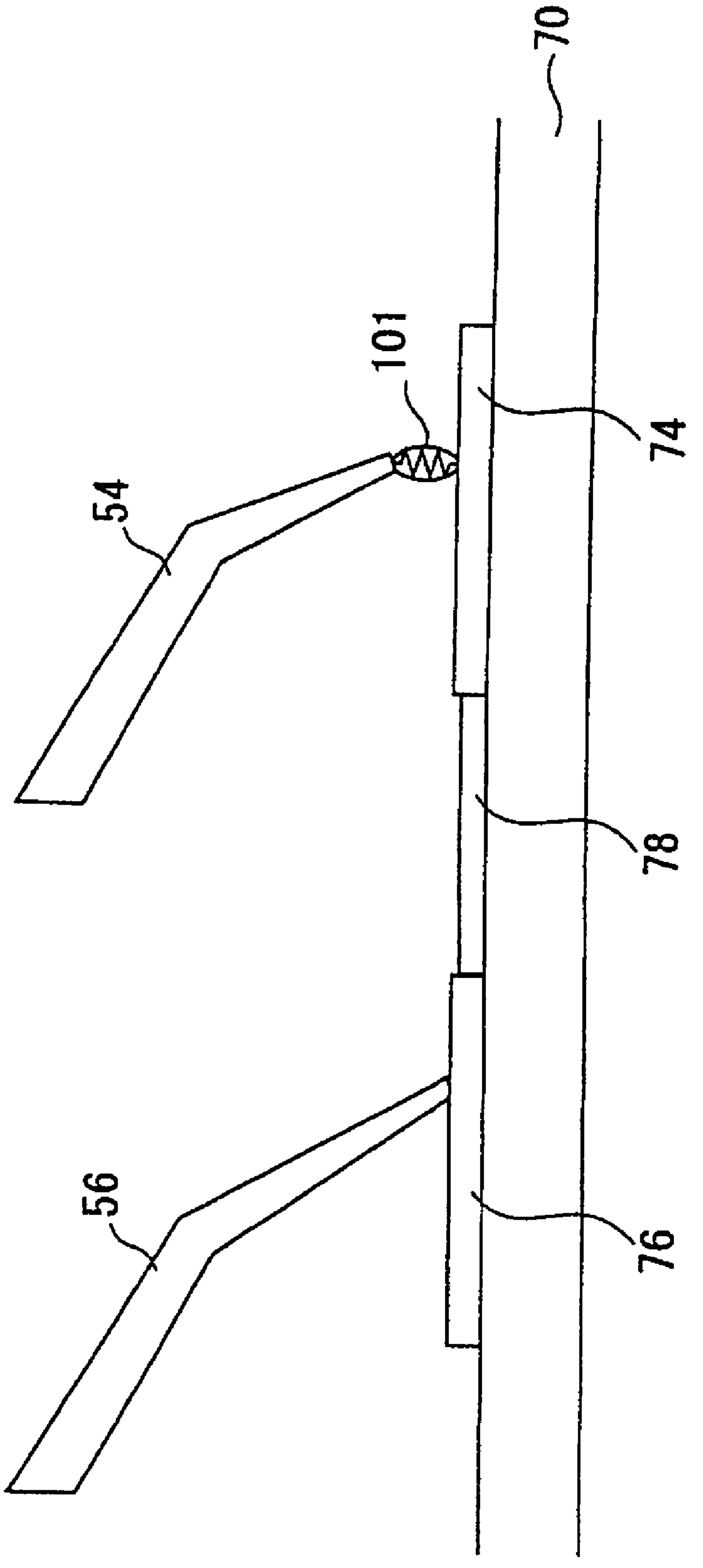
FIG. 2 is a side view of the semiconductor device and probes according to the first embodiment.

The first embodiment of the present invention will be described with reference to FIGS. 1 and 2. FIG. 1 is a schematic view of the operation voltage supply apparatus for a semiconductor device. FIG. 2 shows a voltage application pad 74 and a voltage measurement pad 76 of the semiconductor device 70, and a voltage application probe 54 and a voltage measurement probe 56.

The operation voltage supply apparatus for the semiconductor device is composed of the voltage development device 10 and a probe card 50. The voltage development device 10 includes the variable voltage source 12 and the voltage compensation circuit 14. The voltage compensation circuit 14 is composed of the voltage input terminal 22, the voltage output terminal 24, the measurement voltage input terminal 26, the first operational amplifier 30, and the second operational amplifier 40. The voltage is standardized to the chassis ground of the voltage development device 10. Also, the ground of the semiconductor to be tested is connected to the chassis ground of the voltage development device 10.

The variable voltage source 12 develops a voltage equal to the setting voltage (Vs). The voltage developed at the variable voltage source 12 is applied to the voltage input terminal 22 of the voltage compensation circuit 14. The positive input terminal 32 of the first operational amplifier 30 is connected to the voltage input terminal 22 of the voltage compensation circuit 14. The output terminal 36 of the first operational amplifier 30 is connected to the voltage output terminal 24 of the voltage compensation circuit 14. The output voltage (Vo) is outputted from the voltage output terminal 24. The negative input terminal 34 of the first operational amplifier 30 is connected to the output terminal 46 of the second operational amplifier 40. The positive input terminal 42 of the second operational amplifier 40 is connected to the measurement voltage input terminal 26 of the voltage compensation circuit 14. The output terminal 46 of the second operational amplifier 40 is connected to the positive input terminal 44 of the second operational amplifier 40, forming a voltage follower circuit.

The probe card 50 is provided to separate the voltage application probe 54 and the voltage measurement probe 56 from each other. The voltage application probe 54 electrically connects the voltage application pad 74 of the semiconductor 70 and the voltage output terminal 24 of the voltage development device 10, applying a necessary voltage for the operation of the semiconductor device 70. The voltage measurement probe 56 measures the measurement voltage (Vm) or operation voltage of the semiconductor device by electrically connecting the measurement voltage pad 76 of the semiconductor device 70 and the measurement voltage input terminal 26 of the voltage development device 10. The voltage application pad 74 and the voltage measurement pad 76 of the semiconductor device 70 are connected through the conductor 78 provided on the semiconductor device 70, so that the potentials at the voltage application pad 74 and the voltage measurement pad 76 are equal.

The voltage output terminal 24 and the measurement voltage input terminal 26 of the voltage compensation circuit 14 are connected through the voltage application probe 54, the voltage application pad 74, the conductor 78, the voltage measurement pad 76, and the voltage measurement probe 56. By connecting the voltage output terminal 24 and the measurement voltage input terminal 26, the first operational amplifier included in the voltage compensation circuit 14 also forms a voltage follower circuit. Because the voltage compensation circuit is formed as mentioned above, it operates such that the setting voltage (Vs) at the voltage input terminal 22 and the measurement voltage (Vm) at the measurement voltage input terminal 26 become equal. In other words, the output voltage (Vo) at the voltage output terminal 24 is $Vs+\Delta V$ ($=Vs-Vm$). Inside connections of the voltage development device 10 are made with a printed circuit board or conductors as designed. The voltage follower circuit is able to obtain a resistance value including 0Ω between the output terminal 36 and the negative input terminal 34 of the first operational amplifier 30. Therefore, there is no effect on the operation of the voltage follower circuit even when the deposit 101 adheres to the tip of the voltage application probe 54, increasing the contact resistance between the semiconductor device 70 and the voltage application pad 74.

The compensation circuit 14 described above includes two operational amplifiers, but it is not limited to this structure. Any voltage compensation circuit, which includes the voltage-input terminal, the measurement voltage input terminal, and the voltage output terminal and has a function that controls the measurement voltage (Vm) inputted to the measurement voltage input terminal to be equal to the voltage (Vs) inputted to the voltage input terminal, may be used.

Figure 16:
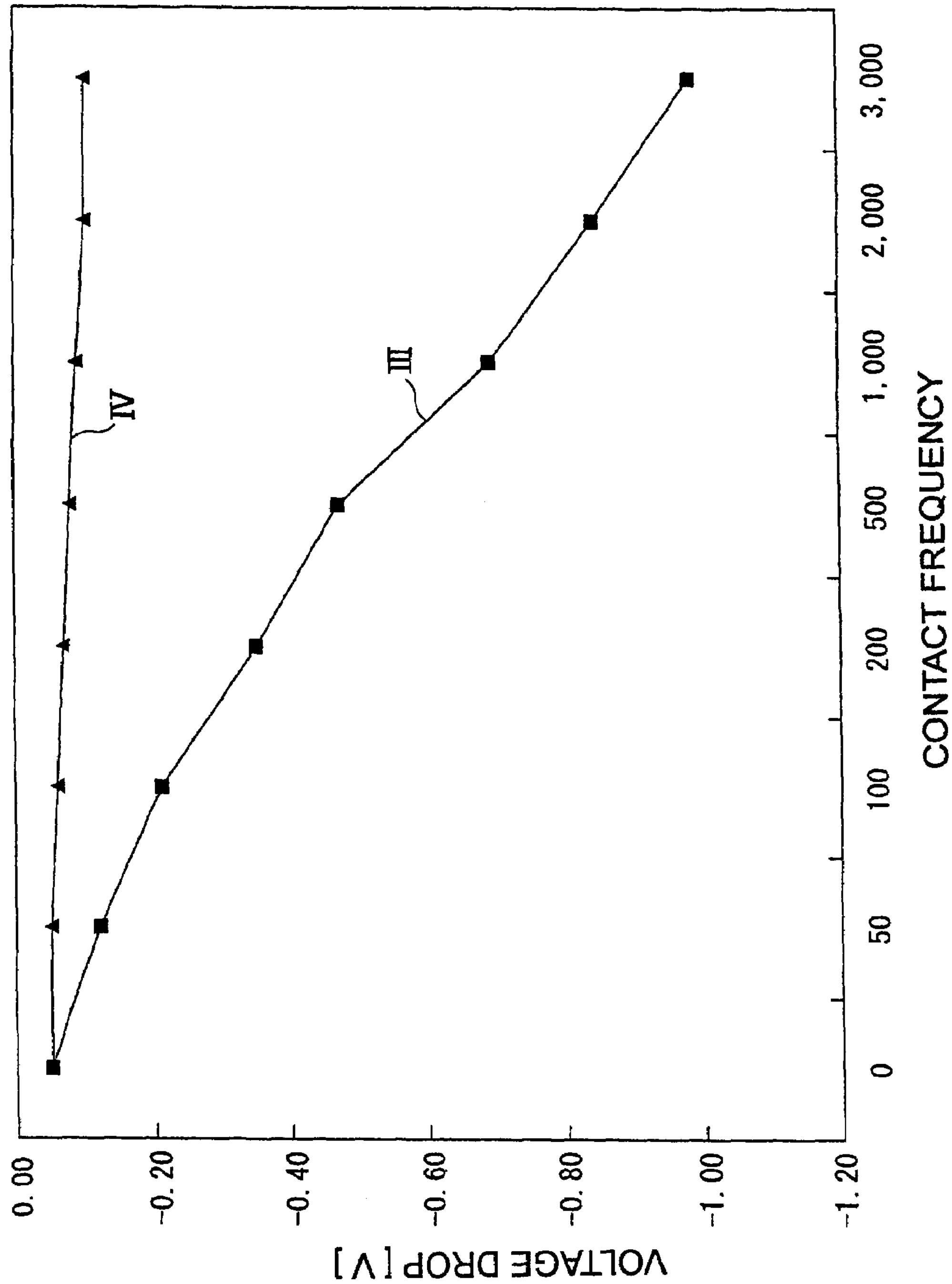
FIG. 16 is a graph showing the voltage drop against the contact frequency between the probe and the semiconductor device.

FIG. 16 shows the voltage drop against the frequency of robe contacts. The current necessary for the operation of the semiconductor device is set at 100 mA. The horizontal axis shows the number of contacts with the voltage source pad by the probe. The vertical axis shows the voltage drop when the current through the probe is 100 mA.

The curved line III in the FIG. 16 shows the voltage drop when the probe contacts the voltage pad at a current of 100 mA. The line IV shows the voltage drop when the probe contacts the voltage pad with no probe current. The use of the voltage supply apparatus described above decrease the frequency of probe polishing because the timing of the probe polishing is determined by the contact resistance of the probe with no current. The probe polishing will be necessary when about 200 times of contacts at an application voltage of 3.3 V and about 100 times of contacts at an application voltage of 2.0 V in the conventional method if the margin of the application voltage for test is 10%. However, by the method of the present invention, the probe polishing is unnecessary with over 3000 times of contacts. Especially, there is a remarkable effect if a low voltage, such as a maximum voltage of 3.3 V, is applied to the semiconductor device.

Second Embodiment

Figure 3:
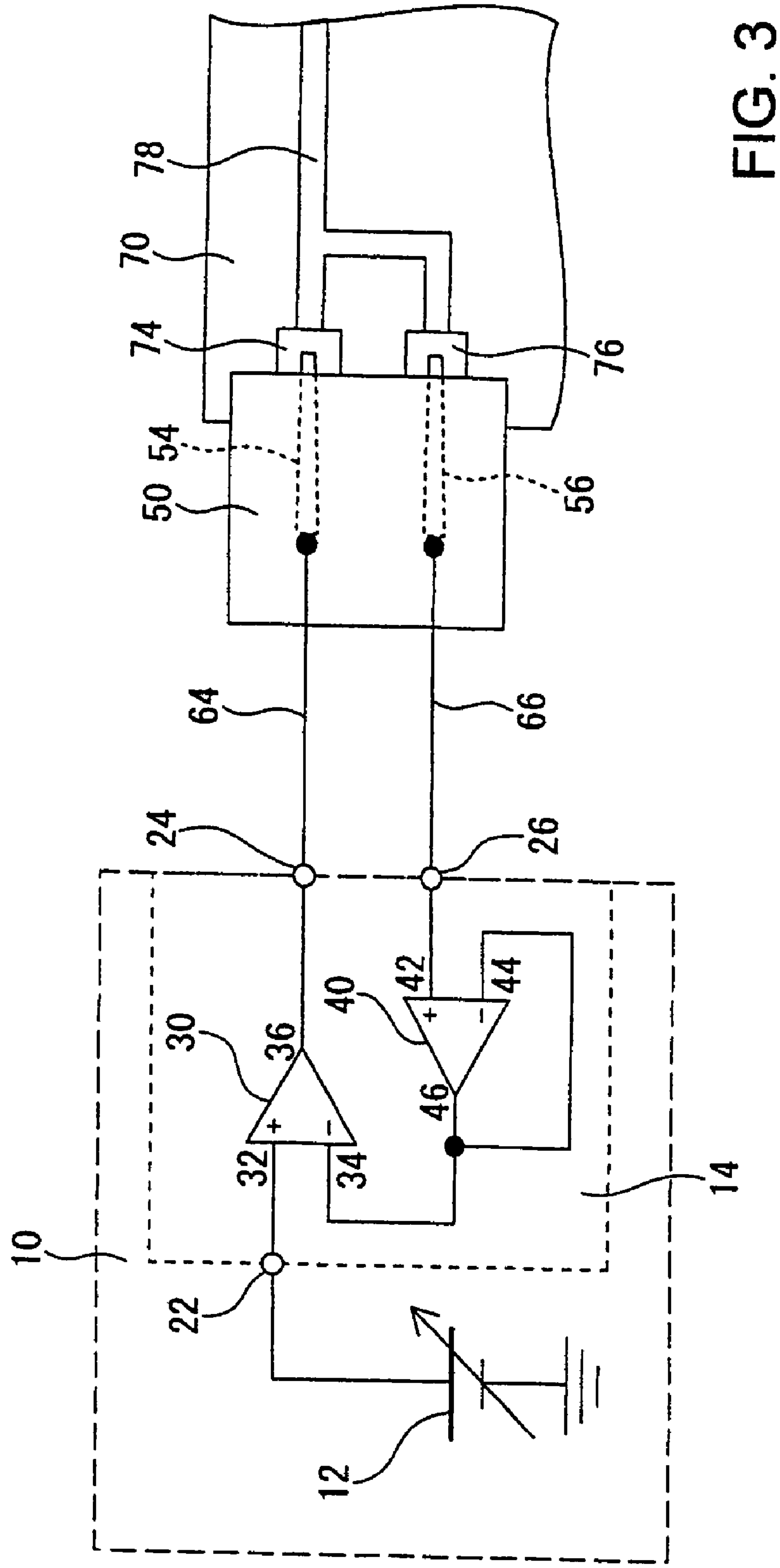
FIG. 3 is a schematic view of the second embodiment.

FIG. 3 schematically shows a circuit structure of the second embodiment. A difference from the first embodiment is that there are conductors between the probe card 50 and the voltage development device 10. Other than that, it is the same as the first embodiment.

The first conductor 64 electrically connects the voltage output terminal 24 and the voltage application probe 54. Also, the second conductor 66 electrically connects the measurement voltage input terminal 26 and the voltage measurement probe 56. It is possible that the spatial relationship between the voltage development device 10 and the semiconductor device 70 is arbitrarily selected because of the first conductor 64 and the second conductor 66.

Third Embodiment

The third embodiment will be described with reference to FIGS. 4 and 5.

Figure 4:
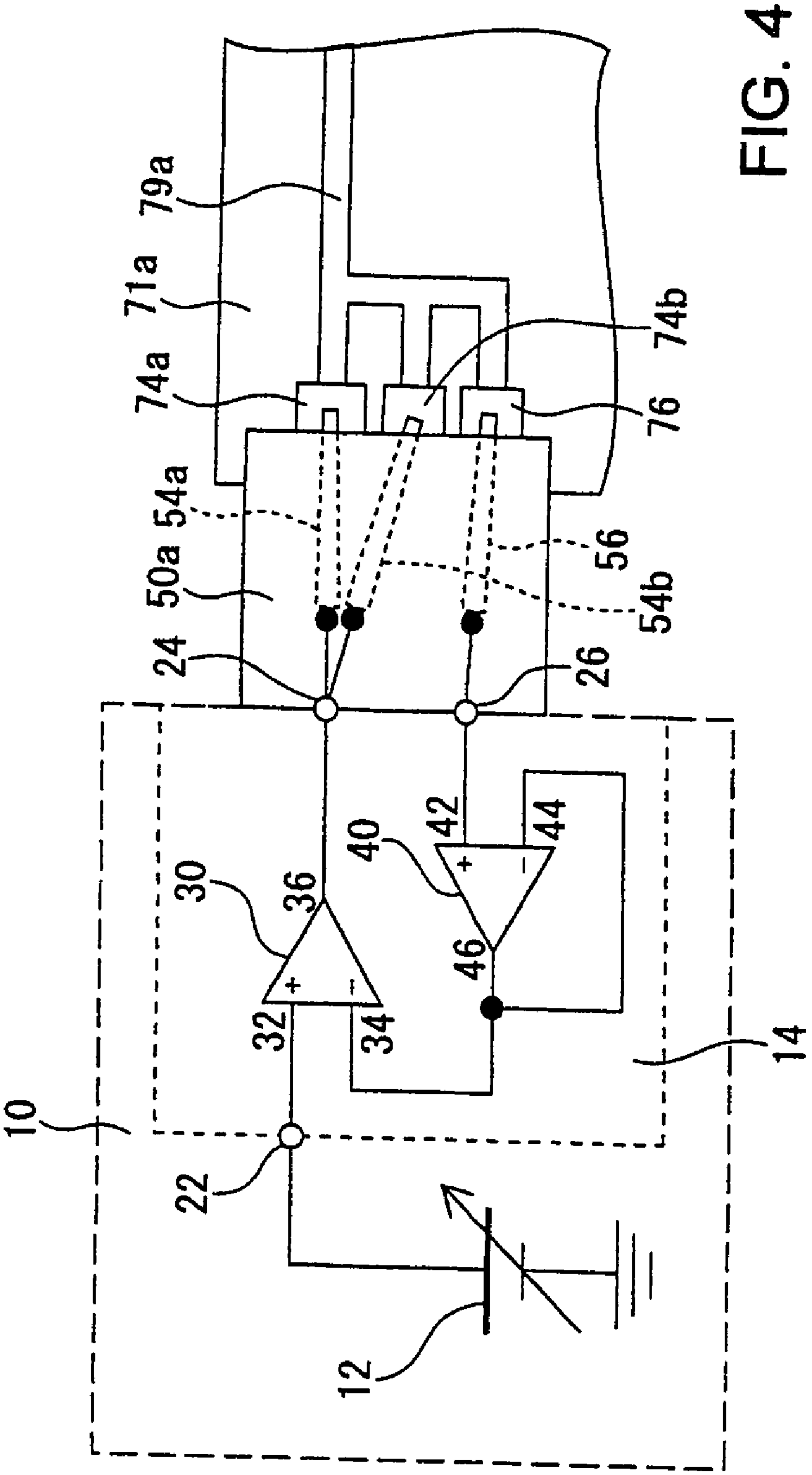
FIG. 4 is a schematic view of the third embodiment.
Figure 5:
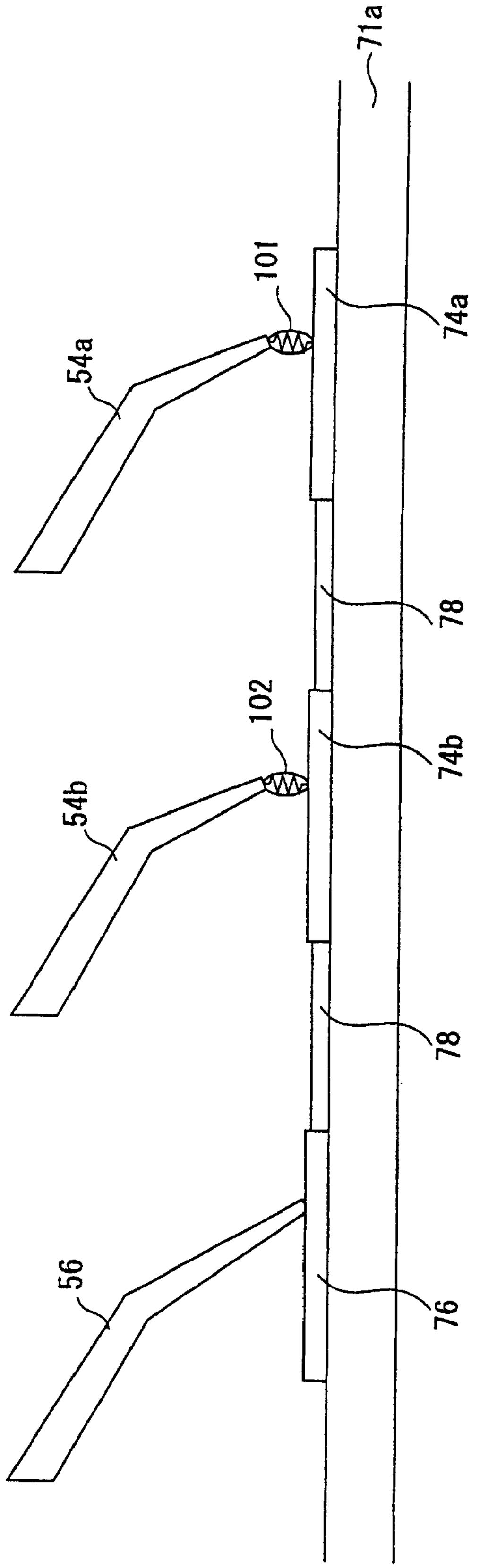
FIG. 5 is a side view of the semiconductor device and probes according to the third embodiment.

FIG. 4 schematically shows a structure of the third embodiment. The structure of the voltage development device 10 is the same as described in the first embodiment.

A semiconductor device 71*a* to be tested has two voltage application pads 74*a* and 74*b* and the voltage measurement pad 76. Each pad is connected with a conductor 79*a*.

A probe card 50*a* has a voltage application probe 54*a*, a voltage application probe 54*b*, and the voltage measurement probe 56 such that they are spaced from each other. The voltage application probe 54*a* and 54*b* are connected to the voltage output terminal 24 at the voltage compensation circuit 14 in the voltage development device 10. FIG. 5 shows that the deposits 101 and 102 adhere to the voltage application probe 54*a* and 54*b*, and the voltage application pad 74*a* and 74*b*.

The current necessary for the operation for the semiconductor device can be over the limit amount of the voltage application probe. In the third embodiment, having two voltage application probes decreases the current through each probe, so that the capability of the voltage supply for the semiconductor device can be increased. Three or more voltage application probes may be provided depending on the necessary current to operate the semiconductor device and the allowable amount of the voltage application probe.

Fourth Embodiment

Figure 6:
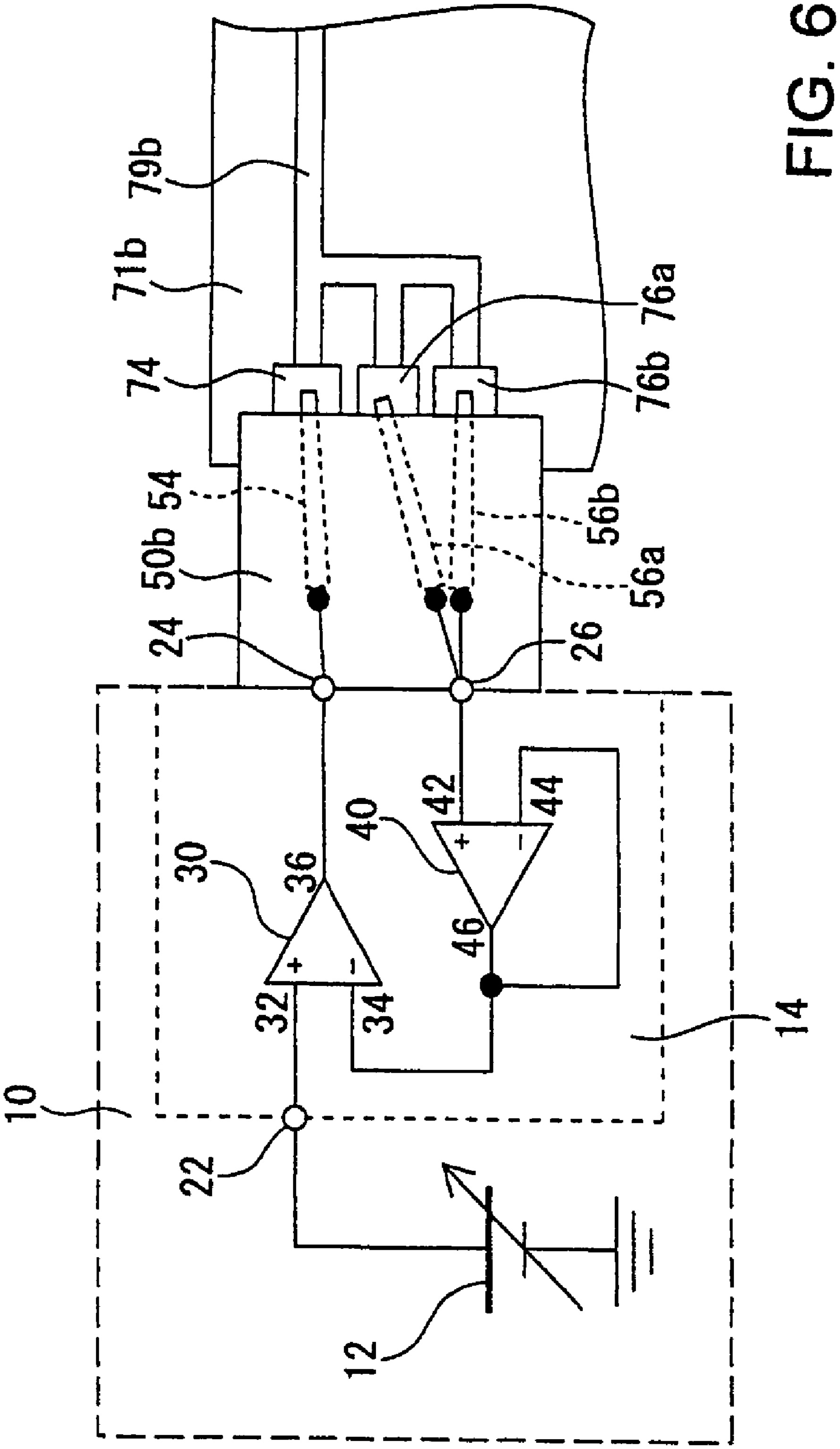
FIG. 6 is a schematic view of the fourth embodiment.
Figure 7:
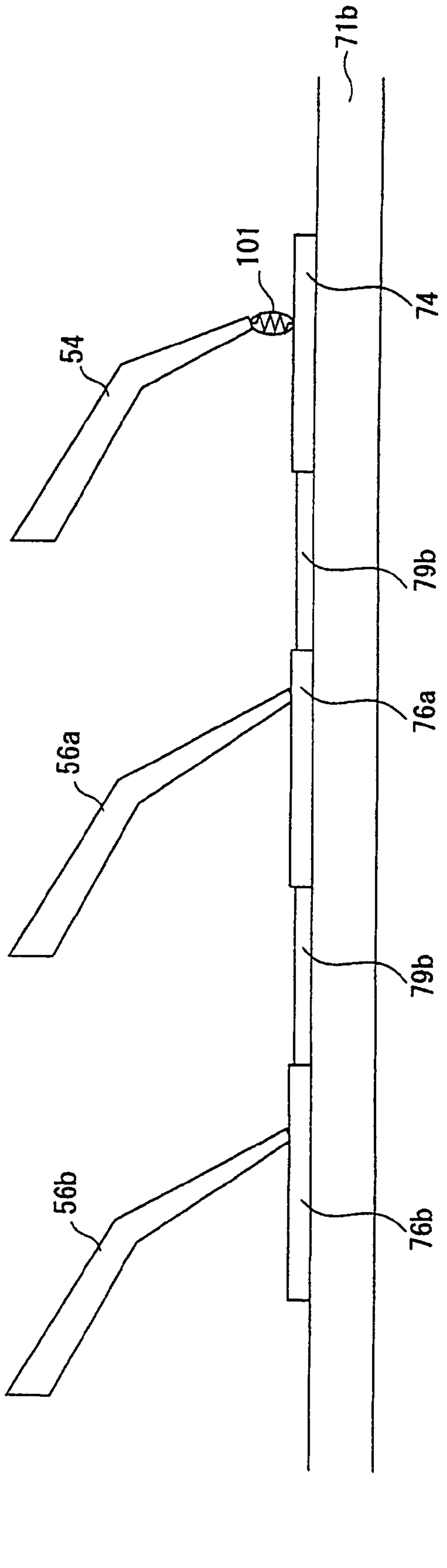
FIG. 7 is a side view of the semiconductor device and probes according to the fourth embodiment.

The fourth embodiment will be described with reference to FIGS. 6 and 7. FIG. 6 schematically shows a circuit structure of the fourth embodiment. The structure of the voltage development device 10 is the same as described in the first embodiment. A semiconductor device 71*b* has the voltage application pad 74, a voltage measurement pad 76*a*, and a voltage measurement pad 76*b*. Each pad is connected by a conductor 79*b*.

A probe card 50*b* is provided with the voltage application probe 54, a voltage measurement probe 56*a*, and a voltage measurement probe 56*b* such that they are spaced from each other. The voltage measurement probe 56*a* and 56*b* are connected to the measurement voltage input terminal 26 of the voltage compensation circuit 14.

When a contact failure occurs between the voltage measurement probe and the voltage measurement pad, a voltage higher than the setting voltage can be applied to the voltage application pad. Providing a plurality of voltage measurement probes helps to reduce the probability for the contact failure between the voltage measurement probe and the voltage measurement pad. Also, the voltage measurement probe may be provided more than three.

Fifth Embodiment

Figure 8:
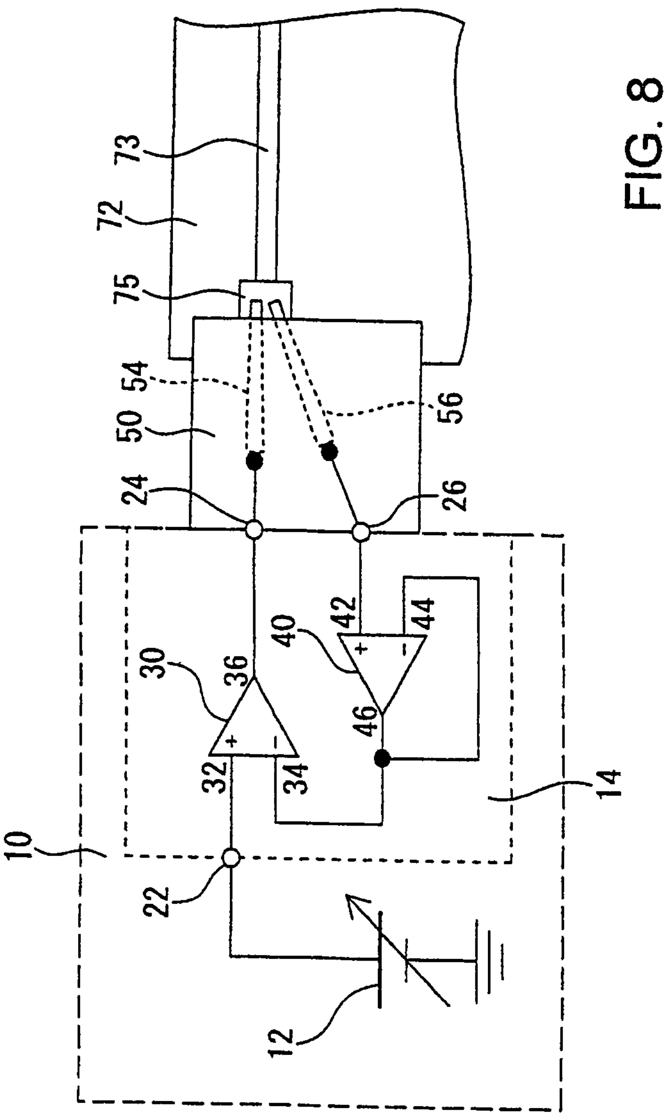
FIG. 8 is a schematic view of the fifth embodiment.
Figure 9:
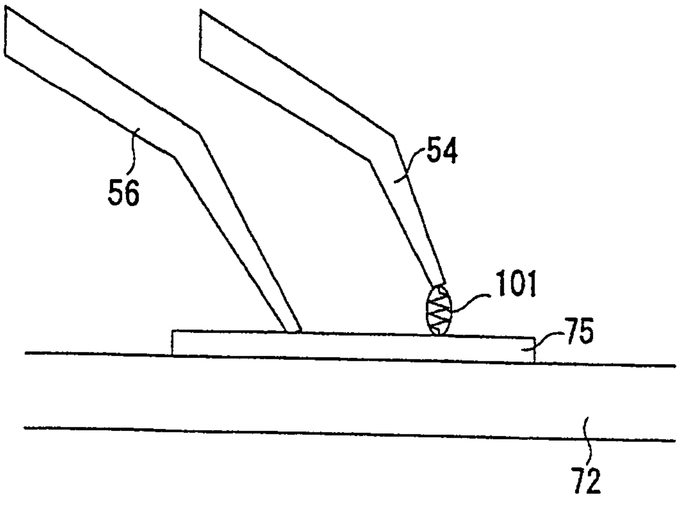
FIG. 9 is a side view of the semiconductor device and probes according to the fifth embodiment.

The fifth embodiment will be described with reference to FIGS. 8 and 9. FIG. 8 schematically shows a structure of the fifth embodiment. The structure of the voltage development device 10 is the same as described in the first embodiment. In the fifth embodiment, the semiconductor device 72 has a single pad 75.

The probe card 50 is provided to separate the voltage application probe 54 and the voltage measurement probe 56. The voltage application probe 54 and the voltage measurement probe 56 are connected to the single pad 75. Generally, the size of a pad is about 80 μm×80 μm and the probe has a diameter of 20-30 μm, so that it is possible to connect them to the pad such that they are spaced from each other.

The operation voltage supply apparatus can be used where only one pad is provided on the semiconductor device.

Sixth Embodiment

In the above description, the operation supply voltage apparatus is for the semiconductor that is in the state of a wafer, but this apparatus is also applicable for the assembled semiconductor device. For the test after the assembly, an interface board is used instead of the probe card, a contact is used instead of the probe, and a voltage source pin instead of the voltage source pad.

Figure 10:
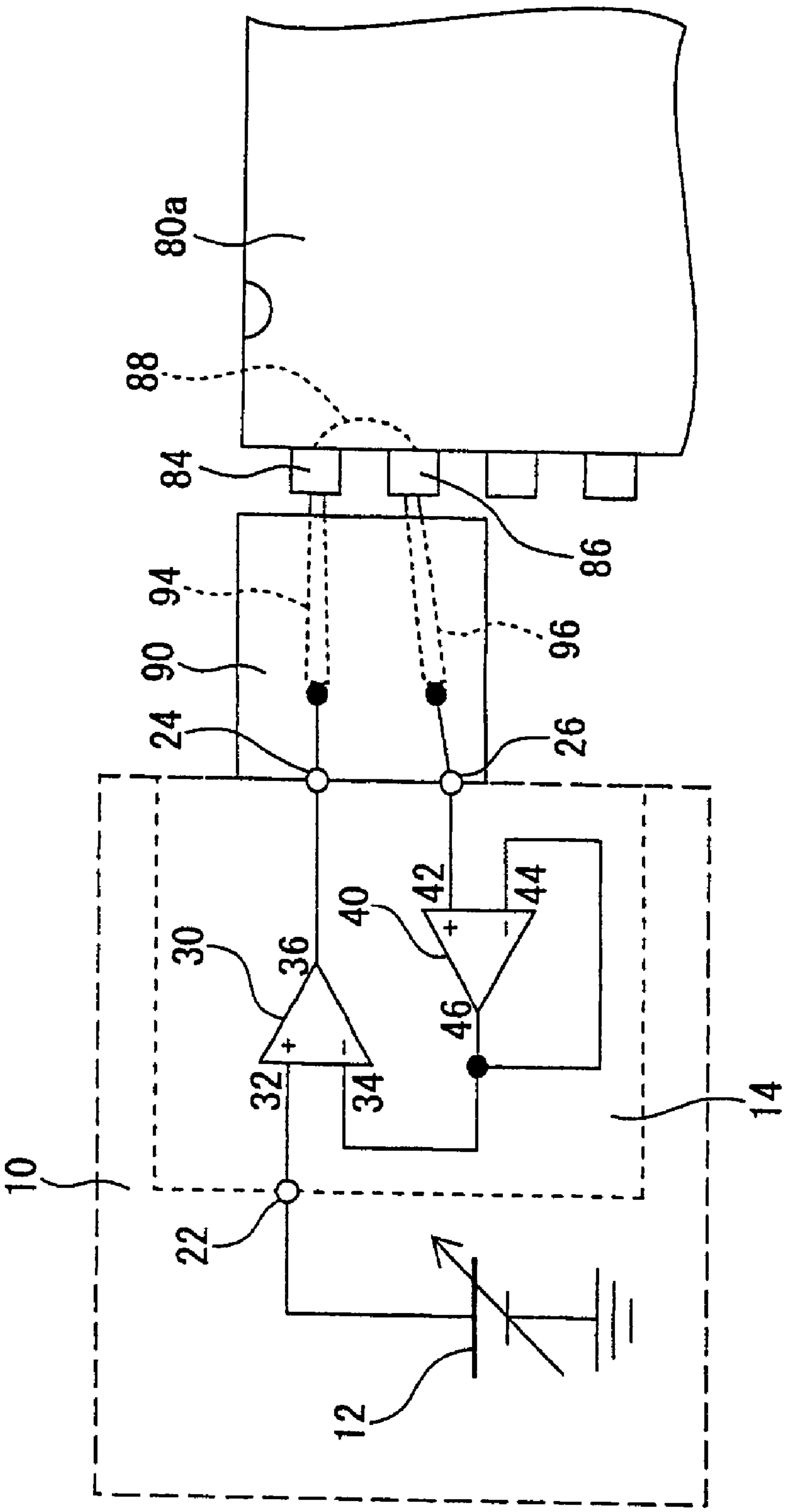
FIG. 10 is a schematic view of the sixth embodiment.

The sixth embodiment will be described with reference to FIG. 10, which schematically shows a circuit structure of the sixth embodiment.

The voltage development device 10 is the same as described in the first embodiment. An interface board 90 has a voltage application contact 94 and a voltage measurement contact 96. For the semiconductor device 80*a* after assembly, a voltage application pin 84 and a voltage measurement pin 86 are provided. The voltage application pin 84 and the voltage measurement pin 86 are connected by a conductor 88. The voltage application contact 94 is connected to the voltage application pin 84, and the voltage measurement contact 96 is connected to the voltage measurement pin 86. After the assembly, it is also possible to apply an accurate voltage to the voltage application pin 84 of the semiconductor device 80*a*.

Seventh Embodiment

Figure 11:
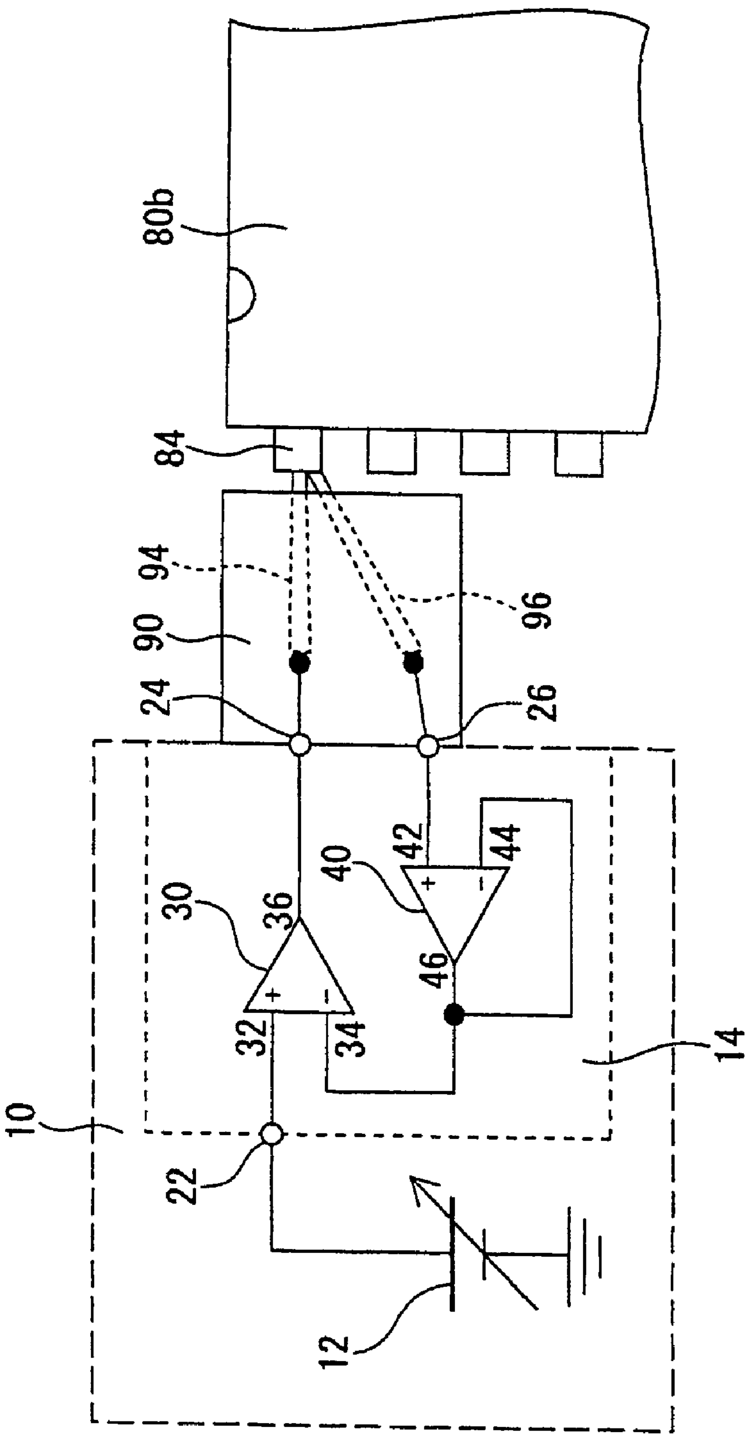
FIG. 11 is a schematic view of the seventh embodiment.
Figure 12:
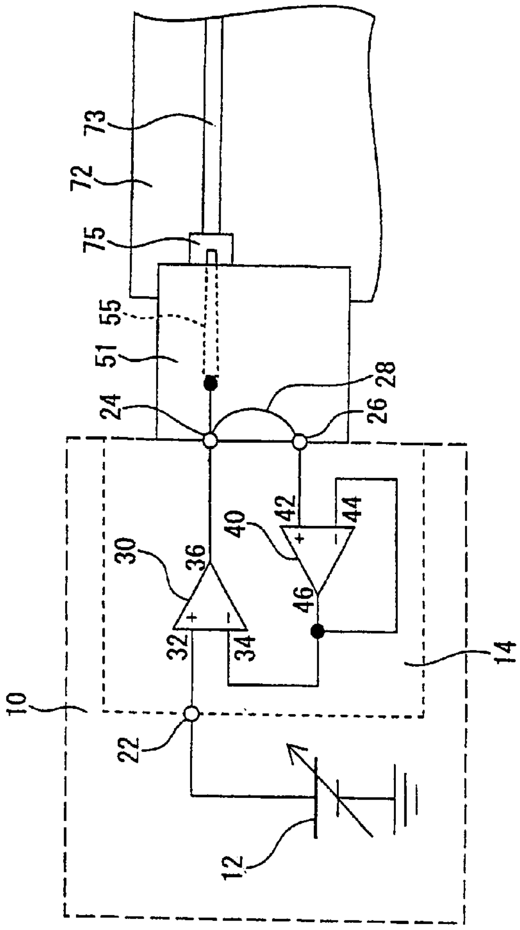
FIG. 12 is a schematic view of the conventional circuit structure.
Figure 13:
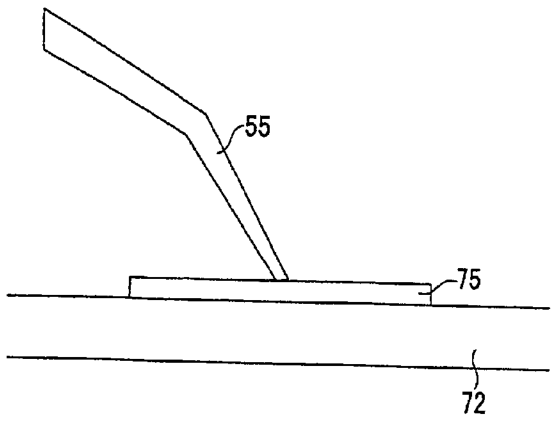
FIG. 13 is a side view of the conventional semiconductor device and probe.
Figure 14:
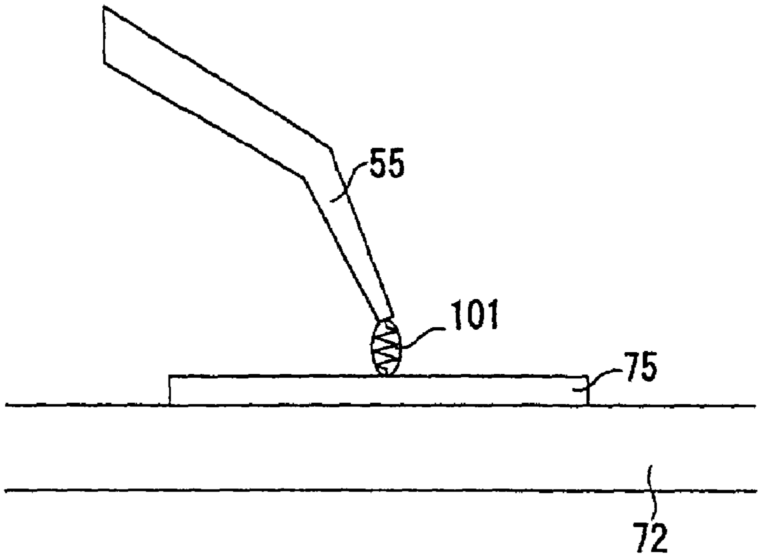
FIG. 14 is a side view of the conventional semiconductor device and probe with a deposit.
Figure 15:
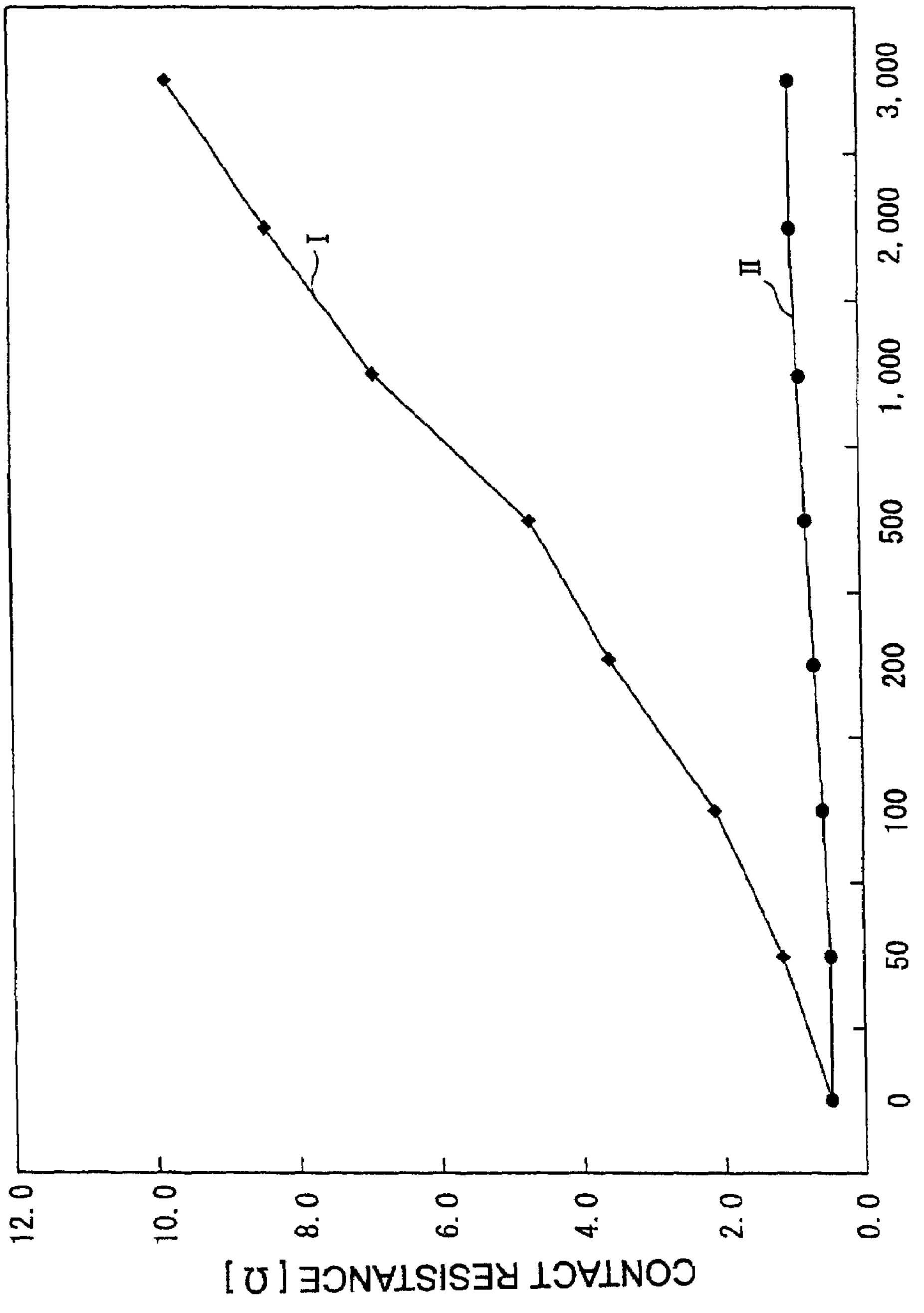
FIG. 15 is a graph showing the contact resistance against the contact frequency between the probe and the semiconductor device.

FIG. 11 schematically shows a circuit structure of the seventh embodiment.

The voltage development device 10 is the same as described in the first embodiment. The interface board 90 is same as described in the sixth embodiment.

The voltage application pin 84 is provided for a semiconductor device 80*b* after assembly. The voltage application contact 94 and the voltage measurement contact 96 are connected to the voltage application pin 84. By this method, an accurate voltage is applied to the voltage application pin 84 of the semiconductor device 80*b* with only a single pin.

What is claimed is:

1. A probe card for using a test of a semiconductor artifact having a plurality of pads including a voltage application pad and a voltage measurement pad, comprising:

an input terminal to be connected to a voltage output terminal of a voltage compensation circuit;

an output terminal to be connected to a measurement voltage input terminal of the voltage compensation circuit;

a voltage application probe for electrically connecting the input terminal and the voltage application pad in the test; and a voltage measurement probe for electrically connecting the output terminal and the voltage measurement pad in the test, wherein said voltage application probe includes a first end electrically connected to the input terminal and a second end electrically connected to the first end of the voltage application probe, and said voltage measurement probe includes a first end electrically connected to the output terminal and a second end electrically connected to the first end of the voltage measurement probe, said first end of the voltage application probe and said first end of the voltage measurement probe are located side by side each other, and wherein said second end of the voltage application probe and said second end of the voltage measurement probe are located side by side each other.

2. The probe card according to claim 1, wherein said voltage application probe is electrically isolated from the voltage measurement probe.

3. The probe card according to claim 2, wherein said voltage application pad is a voltage source pad of the semiconductor artifact.

4. The probe card according to claim 1, wherein said voltage application probe is located apart from the voltage measurement probe.

5. The probe card according to claim 4, wherein said voltage application pad is a voltage source pad of the semiconductor artifact.

6. The probe card according to claim 1, wherein said voltage application pad is a voltage source pad of the semiconductor artifact.

7. The probe card according to claim 1, wherein said input terminal and said output terminal are electrically connected to a voltage generating device, said voltage generating device comprising:

a variable voltage source; and the voltage compensation circuit, said voltage compensation circuit generating a supply voltage based on a voltage from the variable voltage source and a voltage input from the input terminal via the voltage measurement probe, said supply voltage being supplied to the output terminal.

8. A probe card for using a test of a semiconductor artifact having a plurality of pads, comprising:

an input terminal to be connected to a voltage output terminal of a voltage compensation circuit;

an output terminal to be connected to a measurement voltage input terminal of the voltage compensation circuit;

a first voltage application probe for electrically connecting the input terminal and corresponding one of the pads in the test; and a first voltage measurement probe for electrically connecting the output terminal and corresponding one of the pads in the test, wherein said first voltage application probe includes a first end electrically connected to the input terminal and a second end electrically connected to the first end of the first voltage application probe, and said first voltage measurement probe includes a first end electrically connected to the output terminal and a second end electrically connected to the first end of the first voltage measurement probe, said first end of the first voltage application probe and said first end of the first voltage measurement probe are located side by side each other, and wherein said second end of the first voltage application probe and said second end of the first voltage measurement probe are located side by side each other.

9. The probe card according to claim 8, wherein said voltage application probe is electrically isolated from the voltage measurement probe.

10. The probe card according to claim 8, wherein said voltage application probe is located apart from the voltage measurement probe.

11. The probe card according to claim 8, wherein said first voltage application probe and said first voltage measurement probe are electrically connected to a same one of the pads in the test.

12. The probe card according to claim 8, wherein said first voltage application probe and said first voltage measurement probe are electrically connected to different ones of the pads in the test.

13. The probe card according to claim 8, further comprising a second voltage application probe electrically connected to the input terminal and corresponding one of the pads.

14. The probe card according to claim 13, wherein said first voltage application probe and said second voltage application probe are electrically connected to different ones of the pads in the test.

15. The probe card according to claim 8, further comprising a second voltage measurement probe electrically connected to the output terminal and corresponding one of the pads.

16. The probe card according to claim 15, wherein said first voltage measurement probe and said second voltage measurement probe are electrically connected to different ones of the pads in the test.

17. A probe card for using a test of a semiconductor artifact having a plurality of pads, comprising:

an input terminal to be connected to a voltage output terminal of a voltage compensation circuit;

an output terminal to be connected to a measurement voltage. input terminal of the voltage compensation circuit;

a first voltage application probe for electrically connecting the input terminal and corresponding one of the pads in the test; and a first voltage measurement probe for electrically connecting the output terminal and corresponding another one of the pads in the test, wherein said first voltage application probe includes a first end electrically connected to the input terminal and a second end electrically connected to the first end of the first voltage application probe, and said first voltage measurement probe includes a first end electrically connected to the output terminal and a second end electrically connected to the first end of the first voltage measurement probe, said first end of the first voltage application probe being arranged to be away from the first end of the first voltage measurement probe by a distance longer than that between the second end of the first voltage application probe and the second end of the first voltage measurement probe.

* * * * *